United States Patent
Zhu et al.

(10) Patent No.: US 10,224,877 B2
(45) Date of Patent: Mar. 5, 2019

(54) CLOSED-LOOP DIGITAL COMPENSATION SCHEME

(71) Applicant: Cirrus Logic International Semiconductor Ltd., Edinburgh (GB)

(72) Inventors: Lei Zhu, Austin, TX (US); Xin Zhao, Austin, TX (US); John L. Melanson, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 15/581,057

(22) Filed: Apr. 28, 2017

(65) Prior Publication Data
US 2018/0212570 A1    Jul. 26, 2018

Related U.S. Application Data

(60) Provisional application No. 62/448,490, filed on Jan. 20, 2017.

(51) Int. Cl.
*H03F 3/38* (2006.01)
*H03F 1/02* (2006.01)
(Continued)

(52) U.S. Cl.
CPC ............ *H03F 1/0233* (2013.01); *H03F 1/30* (2013.01); *H03F 1/3264* (2013.01); *H03F 1/56* (2013.01); *H03F 3/183* (2013.01); *H03F 3/187* (2013.01); *H03F 3/217* (2013.01); *H03F 3/2171* (2013.01); *H03G 3/3005* (2013.01); *H03G 3/3089* (2013.01); *H03F 2200/03* (2013.01); *H03F 2200/351* (2013.01); *H03F 2200/387* (2013.01);
(Continued)

(58) Field of Classification Search
CPC ......... H03F 1/0233; H03F 3/217; H03F 3/183
USPC ....................................... 330/10, 251, 207 A
See application file for complete search history.

(56) References Cited

U.S. PATENT DOCUMENTS 5,652,542 A    7/1997   Fink
6,316,992 B1   11/2001  Miao et al.
(Continued)

FOREIGN PATENT DOCUMENTS

GB    2496664 A     5/2013
GB    2527677A A    12/2015
(Continued)

OTHER PUBLICATIONS

International Search Report and Written Opinion dated Apr. 5, 2018 from related application PCT/US2018/0147326.
(Continued)

*Primary Examiner* — Khanh V Nguyen
*Assistant Examiner* — Khiem Nguyen
(74) *Attorney, Agent, or Firm* — Norton Rose Fulbright US LLP

(57) ABSTRACT

Resistor mismatch may be digitally compensated based on a known resistor mismatch, power supply information, and/or other operating parameters of the amplifier. The digital compensation may be applied to the digital input signal before conversion for processing and amplification in the analog domain. An amplifier with digital compensation for resistor mismatch may be used in a class-D amplifier with a closed loop and feedforward feedback. A class-D or other amplifier with digital compensation may be integrated with electronic devices such as mobile phones.

24 Claims, 7 Drawing Sheets

(51) Int. Cl.
*H03F 1/56* (2006.01)
*H03F 3/183* (2006.01)
*H03F 3/217* (2006.01)
*H03G 3/30* (2006.01)
*H03F 1/30* (2006.01)
*H03F 1/32* (2006.01)
*H03F 3/187* (2006.01)
*H03M 1/66* (2006.01)

(52) U.S. Cl.
CPC .. *H03F 2200/391* (2013.01); *H03F 2200/421* (2013.01); *H03M 1/66* (2013.01)

(56) References Cited

U.S. PATENT DOCUMENTS

| | | |
|---|---|---|
| 6,603,356 B1 | 8/2003 | Kim et al. |
| 6,724,248 B2 | 4/2004 | Llewellyn |
| 7,812,665 B2 | 10/2010 | Eschauzier et al. |
| 2001/0048344 A1 | 12/2001 | Isken et al. |
| 2007/0194845 A1 | 8/2007 | Kost et al. |
| 2008/0018393 A1 | 1/2008 | Tanaka et al. |
| 2008/0094135 A1 | 4/2008 | Mazda et al. |
| 2008/0130186 A1 | 6/2008 | Nagase et al. |
| 2011/0080217 A1 | 4/2011 | Lee et al. |
| 2013/0120063 A1 | 5/2013 | Lesso |
| 2013/0127531 A1* | 5/2013 | Lesso .............. H03F 3/217 330/251 |
| 2013/0187709 A1 | 7/2013 | Chen |
| 2013/0223652 A1 | 8/2013 | Sahandiesfanjani et al. |
| 2015/0381119 A1 | 12/2015 | Lu et al. |
| 2016/0072465 A1 | 3/2016 | Das et al. |
| 2017/0077882 A1 | 3/2017 | Wang et al. |

FOREIGN PATENT DOCUMENTS

| | | |
|---|---|---|
| WO | 2011/062604 A1 | 5/2011 |
| WO | 2011/064787 A1 | 6/2011 |
| WO | 2016/003597 A2 | 1/2016 |

OTHER PUBLICATIONS

Examination Report dated Aug. 25, 2017 during prosecution of related application GB1704803.4.
Combined Search and Examination Report dated Feb. 8, 2018 during prosecution of related application GB1712743.2.

* cited by examiner

CLOSED-LOOP DIGITAL COMPENSATION SCHEME

CROSS-REFERENCE TO RELATED APPLICATIONS

This application claims priority to U.S. Provisional Patent Application No. 62/448,490 filed Jan. 20, 2017, and entitled "Offset Calibration of Amplifier and Preceding Circuit," which is incorporated by reference.

FIELD OF THE DISCLOSURE

The instant disclosure relates to amplifier circuitry. More specifically, portions of this disclosure relate to compensating for resistor mismatch. Some embodiments of this disclosure relate to audio amplifier circuits.

BACKGROUND

Power supply rejection ratio (PSRR) is an important characteristic for any amplifier. PSRR defines an ability of an amplifier to reject AC-ripple voltage on a supply voltage. PSRR can be expressed as a ratio of amplifier output ripple to power supply AC-ripple. The PSRR of an amplifier is dominated by the degree of resistor mismatch in the feedback resistors and input resistors when input common mode voltage is different from output common mode voltage. Reducing the resistor mismatch can improve PSRR, and thus improve the output quality of the amplifier. One conventional solution is to increase the size of the resistors. However, increasing the size of the resistors increases the circuit size of the amplifier, which is undesirable particularly in amplifiers for mobile devices. Furthermore, conventional manufacturing processes limit the resistor matching to approximately 70 dB under best circumstances. Thus, these conventional solutions are limited in their ability to improve PSRR.

Shortcomings mentioned here are only representative and are included simply to highlight that a need exists for improved electrical components, particularly for amplifiers employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

Conventional techniques for correcting resistor mismatch are based on addressing physical attributes of the resistors, such as size and manufacturing process. Instead, resistor mismatch may be digitally compensated based on a known resistor mismatch, power supply information, and/or other operating parameters of the amplifier. The digital compensation may be applied to the digital input signal before conversion for processing and amplification in the analog domain. An amplifier with digital compensation for resistor mismatch may be used in a class-D amplifier with a closed loop and feedforward feedback. A class-D or other amplifier with digital compensation may be integrated with electronic devices such as mobile phones.

A method for amplifying a signal, such as an audio signal, with an amplifier may include receiving a digital input signal, applying a digital compensation to the digital input signal to compensate for resistor mismatch, converting the digital input signal to an analog signal, and amplifying the analog signal to an output analog signal to drive a load. The digital compensation may be based on a measured resistor mismatch and a measured power supply voltage.

Portions of or all of the methods for amplifying a signal described herein may be implemented in a class-D amplifier, another amplifier circuit, and have portions implemented as a processor-based system. An amplifier circuit for amplifying a signal with digital compensation may include a digital-to-analog converter (DAC) coupled to a digital input node and configured to convert a digital input signal to an input analog signal, an amplifier configured to output an amplified version of the input analog signal, and a digital compensation block coupled to the digital input node and configured to apply digital compensation to the digital input signal to compensate for resistor mismatch. The digital compensation may be based on a measured resistor mismatch and a measured power supply voltage.

The resistor mismatch may be measured prior to the digital compensation in an amplifier. A method for measuring resistor mismatch in an amplifier may include powering down a power stage of the amplifier, driving a load attached to the analog output node from a non-power stage of the amplifier, monitoring a differential input to the non-power stage, and adjusting a digital compensation applied to a digital input node based, at least in part, on the differential input to identify a compensation that eliminates or reduces the resistor mismatch. A compensation may be identified when a first input and a second input of the differential input cross. The identification of the digital compensation to compensate for resistor mismatch may be a calibration processor performed during production testing.

The resistor mismatch measurement, compensation calibration, and compensation application may be implemented in an apparatus such as a mobile phone. The apparatus may include a digital-to-analog converter (DAC) for converting a digital signal to an analog signal. The analog output may be input to an amplifier for amplification and output to a load. A digital compensation block may be applied to a digital signal before input to the DAC. The compensation may compensate for resistor mismatch in input resistors or feedback resistors of the amplifier. The apparatus may also include a controller configured to operate the amplifier to perform resistor mismatch calibration by powering down a power stage of the amplifier, driving a load from a non-power stage component, such as an integrator, monitoring a differential input to the non-power stage component, and adjusting a digital compensation applied to a digital input node using the digital compensation block to identify a digital compensation to compensate for the resistor mismatch.

Electronic devices incorporating the amplifier described above may benefit from improved power supply rejection ratio (PSRR) in components of integrated circuits in the electronic devices. Such an amplifier may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like. The improved PSRR resulting from the resistor mismatch compensation may improve the total harmonic distortion (THD) of the analog output of the amplifier. A higher THD improves a user's experience, such as by providing higher quality audio from the electronic device.

Certain units described in this specification have been labeled as blocks. A block may be a self-contained hardware or software component that interacts with a larger system. A block may include one or more components that are suitably configured to operate according to described functions. For example, a module may be implemented as a hardware circuit comprising custom Very-Large-Scale Integration (VLSI) circuits or gate arrays, off-the-shelf semiconductors such as logic chips, transistors, or other discrete components. A block may also be implemented in programmable hardware devices, such as field programmable gate arrays, programmable array logic, programmable logic devices, a controller, or the like.

Blocks may also include software-defined units or instructions that, when executed by a processing machine or device, retrieve and transform data stored on a data storage device from a first state to a second state. An identified module of executable code in a block may include one or more physical blocks of computer instructions which may be organized as an object, procedure, or function. However, the executables of an identified block need not be physically located together, but may include instructions stored in different locations which, when joined logically together, form the functionality to be performed by the block, and when executed by the processor, achieve the stated function, such as data transformation. A module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
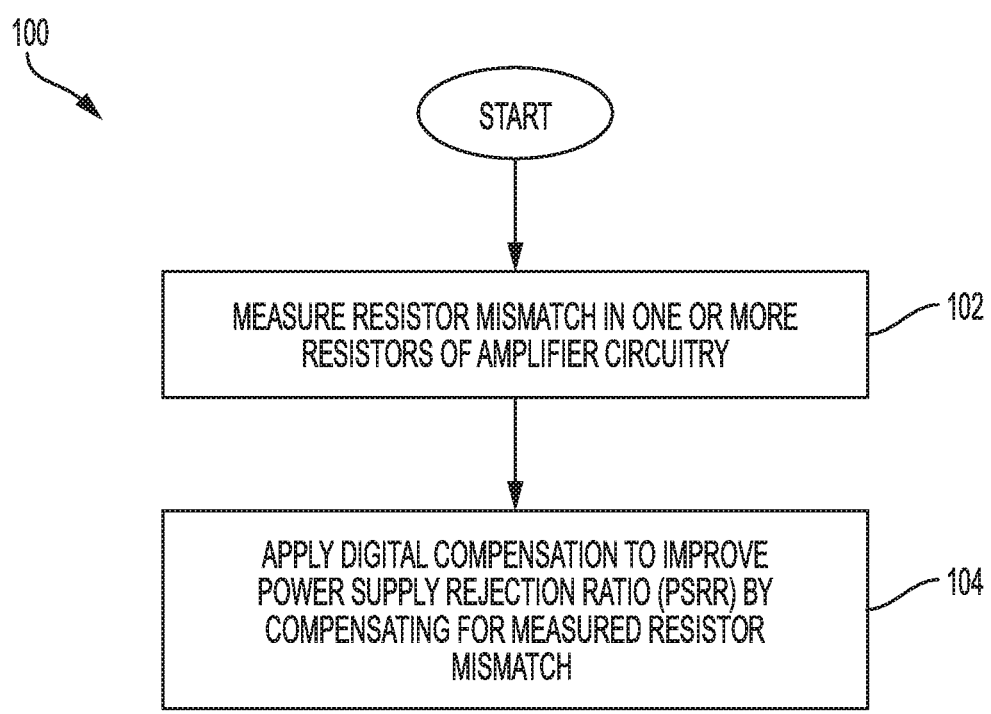
FIG. 1 is a flow chart illustrating an example method for compensating for resistor mismatch in an amplifier circuit according to some embodiments of the disclosure.

Resistor mismatch may be measured and a digital compensation applied for the measured resistor mismatch. A method of digital compensation for resistor mismatch is described with reference to FIG. 1. FIG. 1 is a flow chart illustrating an example method for compensating for resistor mismatch in an amplifier circuit according to some embodiments of the disclosure. A method 100 may begin at block 102 with measuring a resistor mismatch in one or more resistors of an amplifier circuit. The measured resistor mismatch may be mismatch in resistors of a feedback network around an analog domain of the amplifier circuit or mismatch in input resistors to the amplifier. Then, at block 104, a digital compensation may be applied to improve power supply rejection ratio (PSRR) by compensating for at least part of the measured resistor mismatch of block 102.

Figure 2:
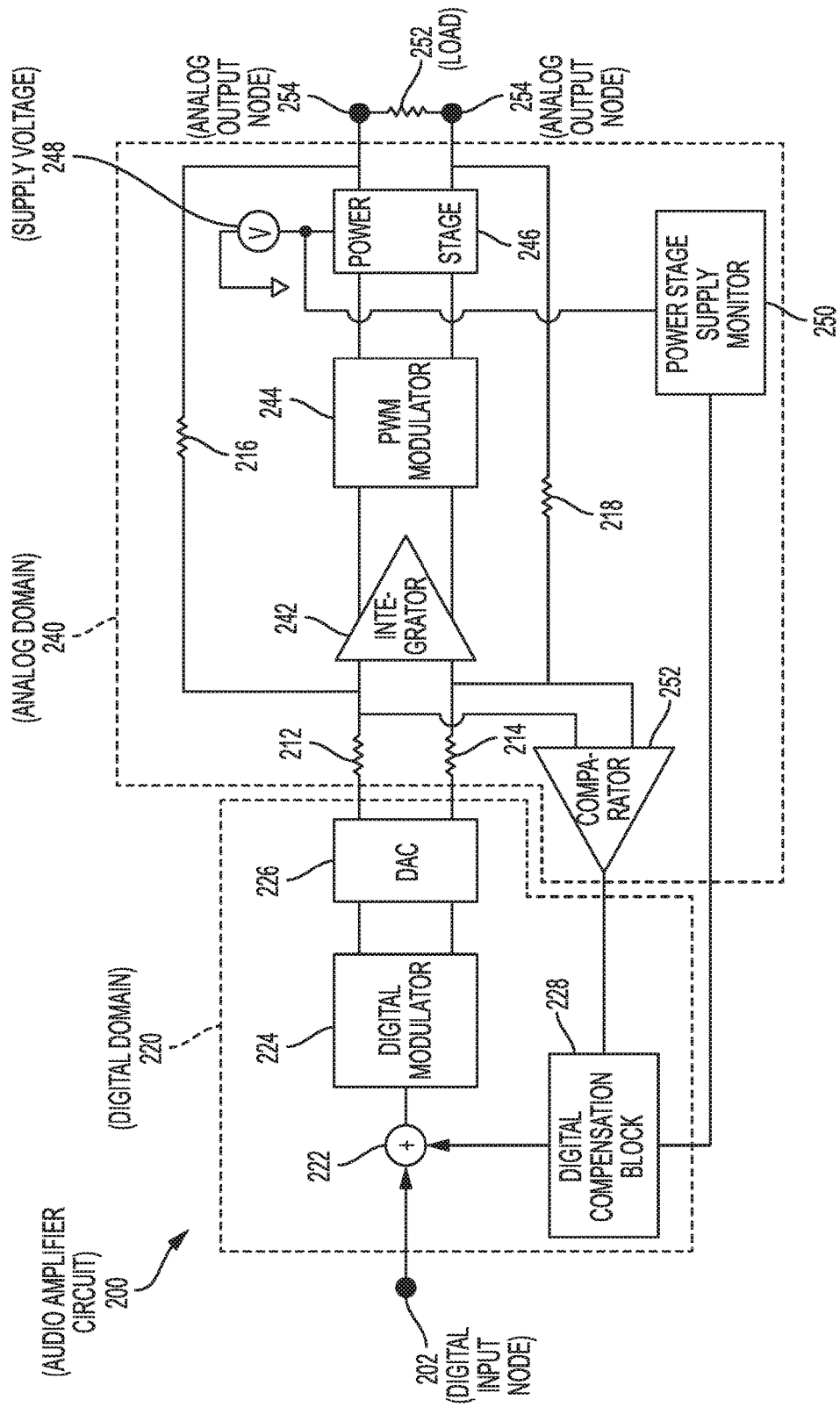
FIG. 2 is a block diagram illustrating an audio amplifier circuit with digital compensation for resistor mismatch according to some embodiments of the disclosure.

One amplifier circuit with resistor mismatch digital compensation is shown in FIG. 2. FIG. 2 is a block diagram illustrating an audio amplifier circuit with digital compensation for resistor mismatch according to some embodiments of the disclosure. An audio amplifier circuit 200 may be configured to execute steps similar to blocks 102 and 104 of FIG. 1. Although a class-D audio amplifier is shown in an audio amplifier circuit 200, other audio amplifiers or amplifiers may be configured similarly for compensating for resistor mismatch. A digital-to-analog converter (DAC) 226 divides the amplifier circuit 200 into a digital domain 220 and an analog domain 240. An input to the digital domain 220 is received at digital input node 202. The received digital input signal is converted to an analog signal, and that analog signal amplified to produce an analog output signal at analog output node 254.

The digital domain 220 may process the digital input signal before conversion to analog signal by DAC 226. For example, the digital domain 220 may include a mixer 222 coupled to the digital input node 202. The mixer 222 may combine a received digital input signal with digital compensation applied by a digital compensation block 228. The digital compensation block 228 may output a digital code that is added to the digital input signal by mixer 222. The digital code generated by the digital compensation block 228 when applied to the digital input signal may partially or completely compensate for a resistor mismatch within the amplifier circuit 200.

A closed loop may be formed from components in the digital domain 220 and the analog domain 240 to generate an input to the digital compensation block 228. A closed loop may be formed by basing the output of the digital compensation block 228 on a node between an output of the digital domain 220, an input of the analog domain 240, and an output of the analog domain 240. For example, a comparator 252 may monitor voltages at the differential output of the digital domain by coupling to resistors 212, 214, 216, and 218. An output of the comparator 252 may be provided to the digital compensation block 228. Other feedback may be provided to the digital compensation block 228 for applying a digital code to the digital input signal. For example, a power stage supply monitor 250 may monitor a supply voltage 248 and provide information regarding the supply voltage 248 to the digital compensation block 228.

Components in the digital domain 220 and the analog domain 240 operate to generate an analog output signal based on a digital input signal. A digital input signal received at digital input node 202 is adjusted at mixer 222 to compensate for resistor mismatch, after which the compensated digital input is provided to a digital modulator 224 and a digital-to-analog converter (DAC) 226. The output of the DAC 226 is an analog signal that is provided to components in analog domain 240 through input resistors 212 and 214. The analog domain 240 includes an integrator 242, a pulse width modulation (PWM) modulator 244, and a power stage 246 coupled to the analog output of the digital domain 220. The power stage 246 outputs an analog output voltage at analog output node 254 across a load 252. Feedback resistors 216 and 218 couple the analog output voltage to other components in the analog domain 240, such as the integrator 242 and the comparator 252. The resistors 216 and 218 may provide a closed loop feed forward configuration for operation of the amplifier circuit 200.

An amplifier, such as shown in FIG. 2, may operate according to the method shown in FIG. 1 to improve a power supply rejection ratio (PSRR) of the amplifier. Referring to FIG. 1, the PSRR may be improved by measuring a resistor mismatch in the amplifier circuitry at block 102 and applying a digital compensation based on the measured resistor mismatch at block 104. The measurement of resistor mismatch may be performed using a test load resistor coupled to the analog output node 254. One method of measuring the resistor mismatch is shown in FIG. 3.

Figure 3:
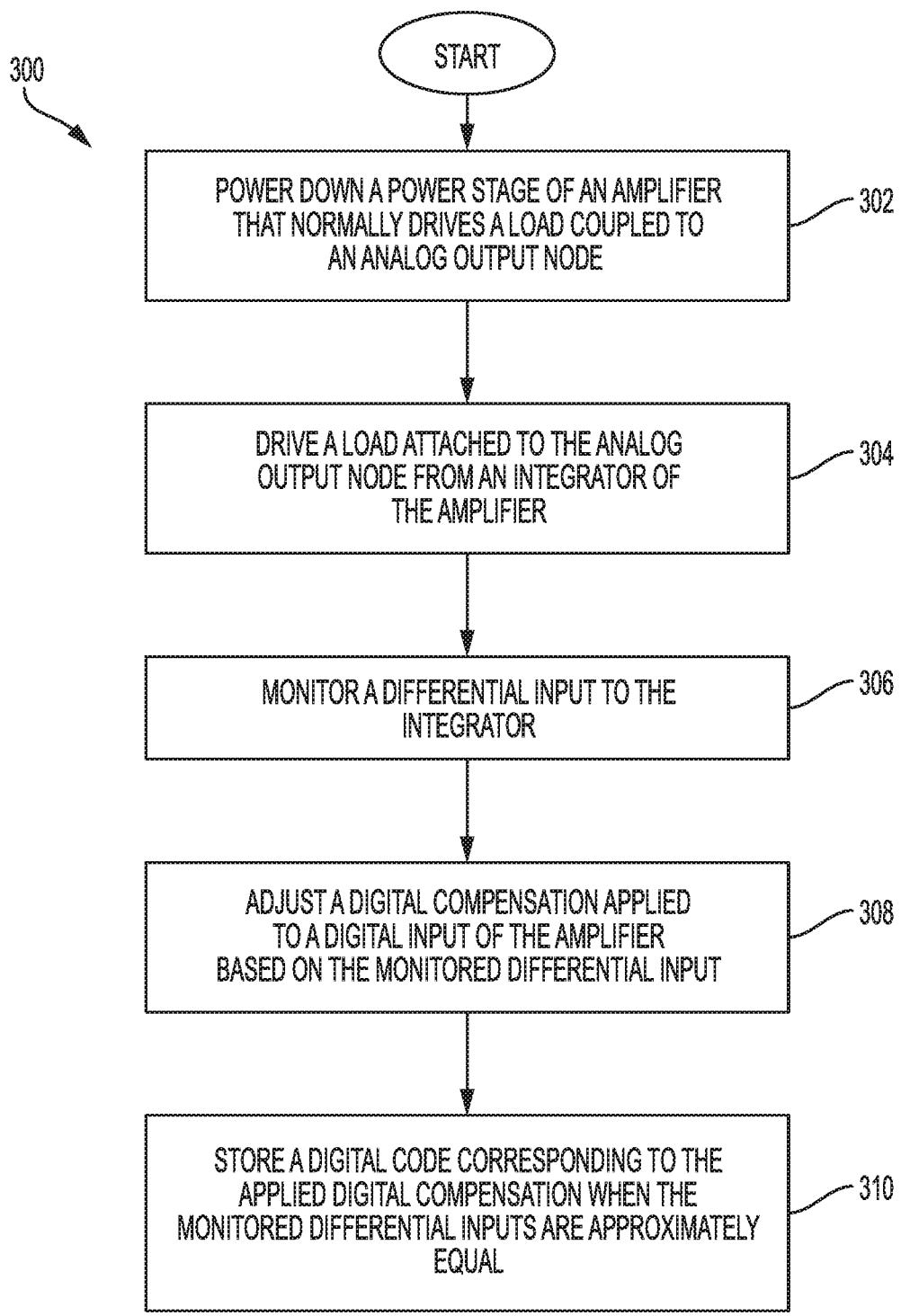
FIG. 3 is a flow chart illustrating an example method for measuring resistor mismatch in an amplifier circuit according to some embodiments of the disclosure.

FIG. 3 is a flow chart illustrating an example method for measuring resistor mismatch in an amplifier circuit according to some embodiments of the disclosure. During initial steps, an amplifier may be configured for measurement of resistor mismatch, such as by coupling a test load to an output node and configuring circuitry to drive the test load. A method 300 begins at block 302 with powering down a power stage of the amplifier that normally drives a load coupled to the analog output node. For example, in the amplifier 200 of FIG. 2, the power stage 246 may be powered down. Next, at block 304, a load at the analog output node may be driven from a non-power stage component of the amplifier, such as an integrator, which is coupled to the analog output node through the power stage. For example, in the amplifier 200, the integrator 242 may drive the load 252. The load 252 may be driven to a reference voltage different from a DAC output common mode voltage. A test load may be used for the load 252 during the resistor mismatch measurement of FIG. 3. In some embodiments, the test load may be integrated with the amplifier circuit 200 and coupled through switches to the analog output node 254, in which the switches are toggled to active or deactivate a test mode.

The measurement is then performed after the amplifier is configured for performing measurements of the resistor mismatch. At block 306, a differential input to the analog domain may be monitored to obtain an indication proportional to the resistor mismatch. For example, in the amplifier 200, the comparator 252 may monitor the differential input to the integrator 242. A first input to the comparator 252 may be based, in part, on the resistance values of resistors 212 and 216. A second input to the comparator 252 may be based, in part, on the resistance values of resistors 214 and 218. The comparator 252 may compare the values from the first input and the second input and output a '1' value when the first input is greater than the second input and output a '0' value when the second input is greater than the first input. Mismatch between the resistors 212, 214, 216, and 218 generate a difference between the first input and the second input. The digital compensation block 228 receives the '0' or '1' output from the comparator 252. At block 308, the digital compensation applied to a digital input of the amplifier may be adjusted based on the monitored differential input. For example, in the amplifier 200, the digital compensation block 228 may adjust a digital code output to the mixer 222 upwards when a '1' is received from the comparator 252 and downwards when a '0' is received from the comparator 252. The digital compensation block 228 may continue to increase or decrease the digital code according to a search algorithm to identify a digital code that approximately cancels out the monitored resistor mismatch of block 308. The identified digital code corresponds to the digital compensation that results in the differential inputs to the comparator 252 being approximately equal. Such a digital code may be, for example, a digital code that if incremented by a certain step size, such as the step size of the search algorithm, produces a '1' output from the comparator 252, and that if decremented by the step size produces a '0' output from the comparator 252. Another example of an identified digital code may be a digital code that causes the first input to cross the second input, such that the comparator 252 output flips from a '0' to a '1' or a '1' to a '0.'

The code may be stored and used during operation of the amplifier to cancel the resistor mismatch after a digital compensation is identified by the adjustment of block 308 to satisfy certain criteria indicating that the resistor mismatch is sufficiently compensated. At block 310, the digital code is stored, in which the stored digital code results in the monitored differential inputs being approximately equal. The memory may be a non-volatile memory internal to the digital compensation block. The memory may alternatively be a non-volatile memory external to the digital compensation block. For example, the digital code may be stored in an EEPROM, BIOS, or controller. In some embodiments, external non-volatile memory may be combined with volatile memory. For example, an embedded controller of a mobile device may store the digital code, and the digital code loaded from the embedded controller to an internal memory in the digital compensation block 228. The stored digital code may be used to compensate for resistor mismatch during operation of the amplifier.

Additional measurements of resistor mismatch may be performed at different amplifier configurations. For example, a digital code may be obtained by repeating the method of FIG. 3 for multiple gain settings of the amplifier. Digital codes for additional gain settings may be interpolated from the measurements at specific gain settings. When multiple digital values are obtained for resistor mismatch compensation, the digital codes may be stored in a look-up table or as a formula in non-volatile memory at block 310.

Figure 4:
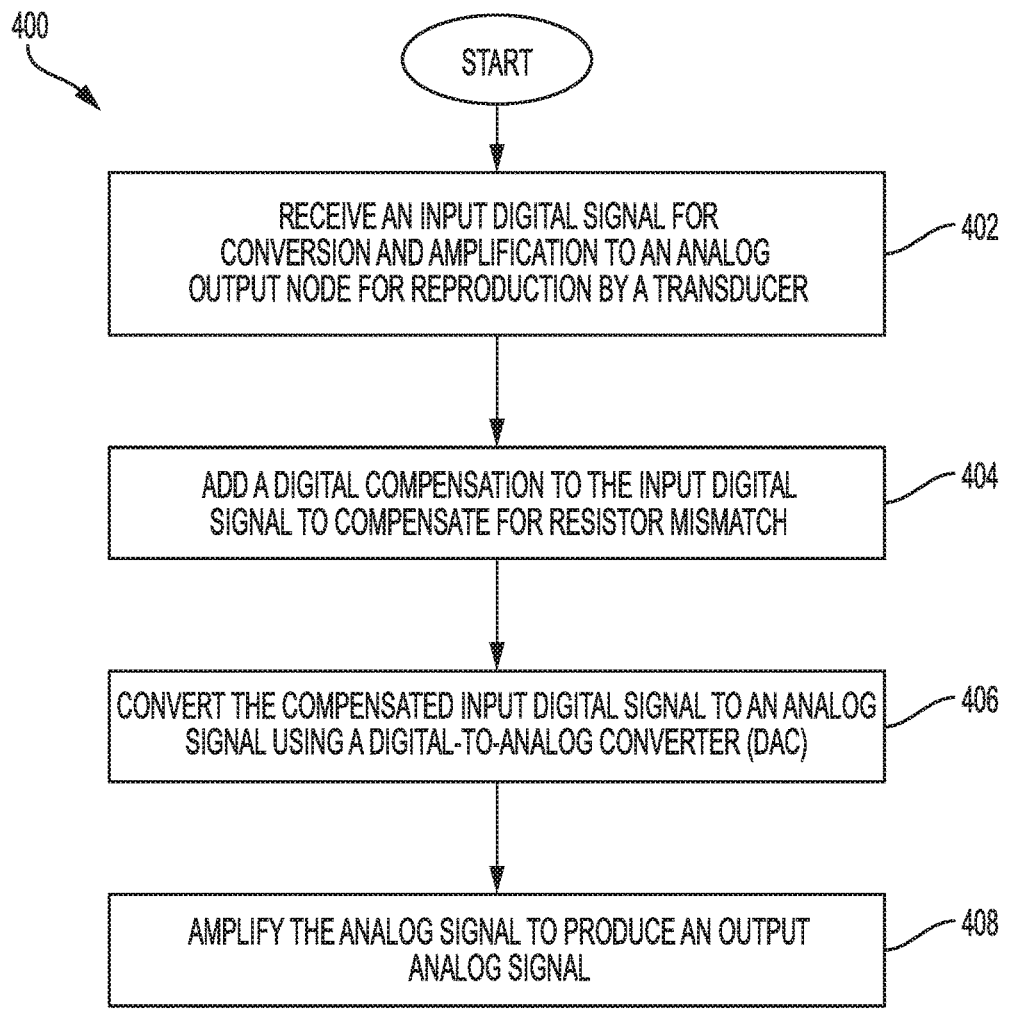
FIG. 4 is a flow chart illustrating an example method of digitally compensating for resistor mismatch in an amplifier circuit according to some embodiments of the disclosure.

Referring back to FIG. 1, digital compensation may be applied at block 104 in an amplifier based on the digital code or digital codes obtained from resistor mismatch measurement performed at block 102. One example method for operating an amplifier to cancel resistor mismatch with digital compensation is described with reference to FIG. 4. FIG. 4 is a flow chart illustrating an example method of digitally compensating for resistor mismatch in an amplifier circuit according to some embodiments of the disclosure. A method 400 may begin at block 402 with receiving a digital input signal for reproduction and amplification to an analog output node. For example, in amplifier circuit 200 of FIG. 2, a digital input signal may be received at digital input node 202. The digital input signal may be, for example, a music file, a ringtone, or a telephone call. The digital input signal is reproduced at a speaker output by converting the digital signal to an analog signal and amplifying the analog signal to produce an output analog signal. The output analog signal may then be used to drive a transducer, such as a speaker or headphones.

During conversion and amplification of the digital input signal, digital compensation may be applied to compensate for the resistor mismatch. At block 404, a digital compensation is added to the digital input signal to compensate for the resistor mismatch. For example, in amplifier circuit 200, a digital code is output by the digital compensation block 228 and added to the digital input signal by mixer 222. The output of mixer 222 is a compensated digital signal, which is converted to an analog signal at block 406, such as by the digital modulator 224 and DAC 226. The analog signal is then amplified at block 408, such as by the power stage 246 to produce an output analog signal at output node 254. The transducer or other load may be coupled to the output node 254 to receive the analog output signal.

Figure 5:
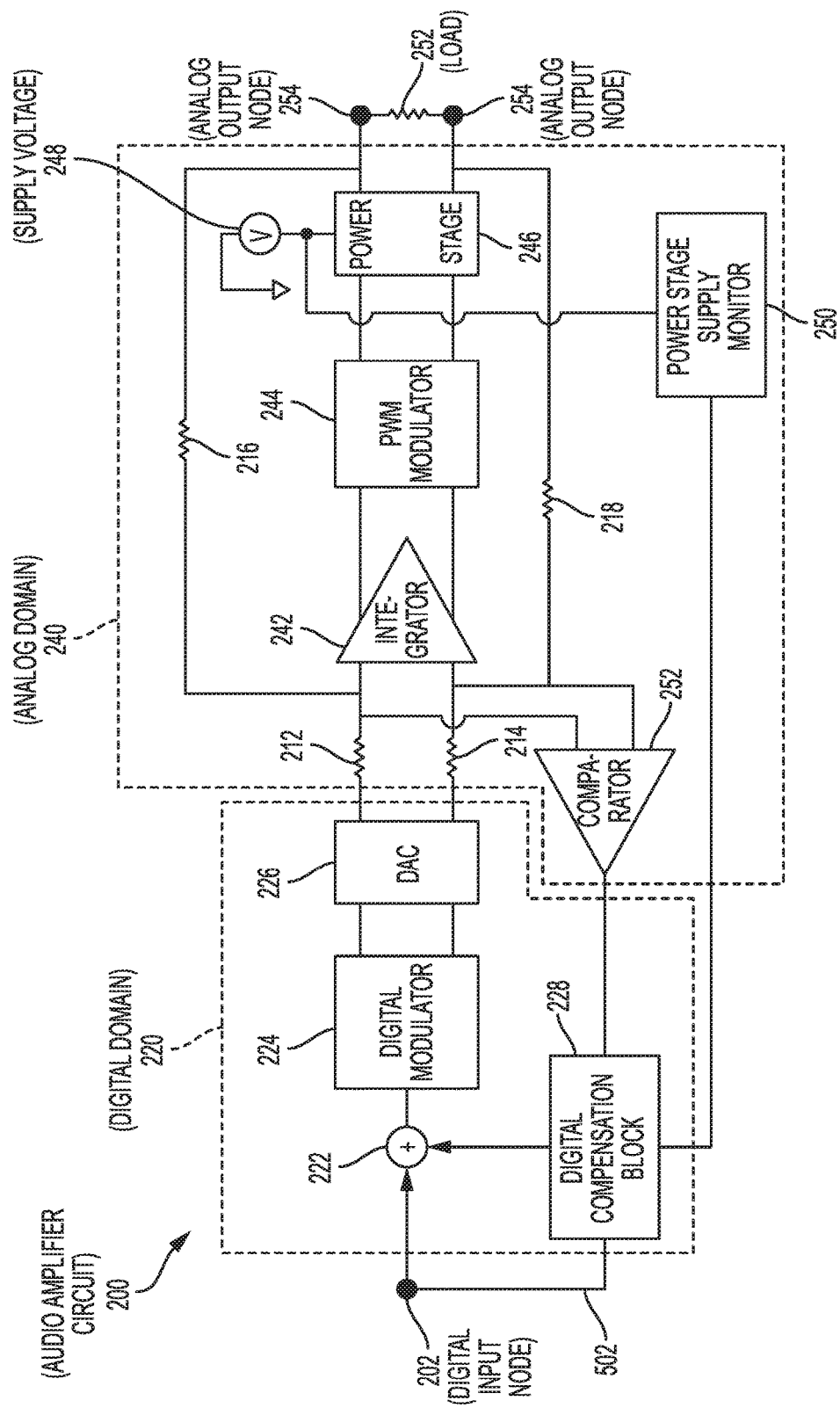
FIG. 5 is a block diagram illustrating an audio amplifier circuit with digital compensation for resistor mismatch based on predicted output duty cycle according to some embodiments of the disclosure.

The digital compensation applied at block 404 may be fixed during operation of the amplifier or may be adjusted during operation of the amplifier. The digital compensation may be adjusted based on changes in a supply voltage at block 408. Adjustment based on supply voltage may be performed by retrieving a digital code stored during the resistor mismatch calibration of FIG. 3 and adjusting based on the following equation:

$$\text{compensation} = \frac{\left(\frac{V_{supply}}{2} - V_{CM,DAC}\right)}{(V_{ref} - V_{CM,DAC})} * \text{stored\_code},$$

where stored_code is the retrieved digital code, $V_{supply}$ is the supply voltage, $V_{CM,DAC}$ is the common mode voltage of the DAC, and $V_{ref}$ is the reference voltage used to drive the load during resistor mismatch measurement. In some embodiments, the power supply voltage may be assumed as a constant value that is measured once and used to determine the digital compensation. In some embodiments, the power supply voltage may be monitored in real-time, such as by monitor 250 in FIG. 2, and the digital compensation adjusted at periodic or non-periodic intervals during the conversion and amplification of blocks 406 and 408. The monitor 250 may have a bandwidth comparable to an input signal to the amplifier. The digital compensation may also or alternatively be adjusted based on changes in a gain setting for the amplifier. The digital compensation may be adjusted based on a predicted output duty cycle of the amplifier. For example, the digital compensation block 228 may be coupled to the digital input node 202 to receive the digital input signal and determine a duty cycle at the analog output node 254 based on the digital input signal. The duty cycle may be predicted for each PWM clock cycle according to the following equation:

$$\text{duty\_cycle} = V_{in} * \text{gain} \div V_{supply},$$

where $V_{in}$ is the digital input signal, gain is the analog gain calculated as the ratio of feedback resistance to input resistance, and $V_{supply}$ is the supply voltage. The predicted output duty cycle may be used to adjust a digital code output to the mixer 222 for compensating resistor mismatch. The adjustment may be performed by multiplying the adjustment calculated above for supply voltage by the predicted duty cycle value. FIG. 5 is a block diagram illustrating an audio amplifier circuit with digital compensation for resistor mismatch based on predicted output duty cycle according to some embodiments of the disclosure. In FIG. 5, the digital compensation block 228 has an output signal 502 that is coupled to the digital input node 202. Some or all of these factors may be used in determining a digital compensation for compensating resistor mismatch.

Figure 6:
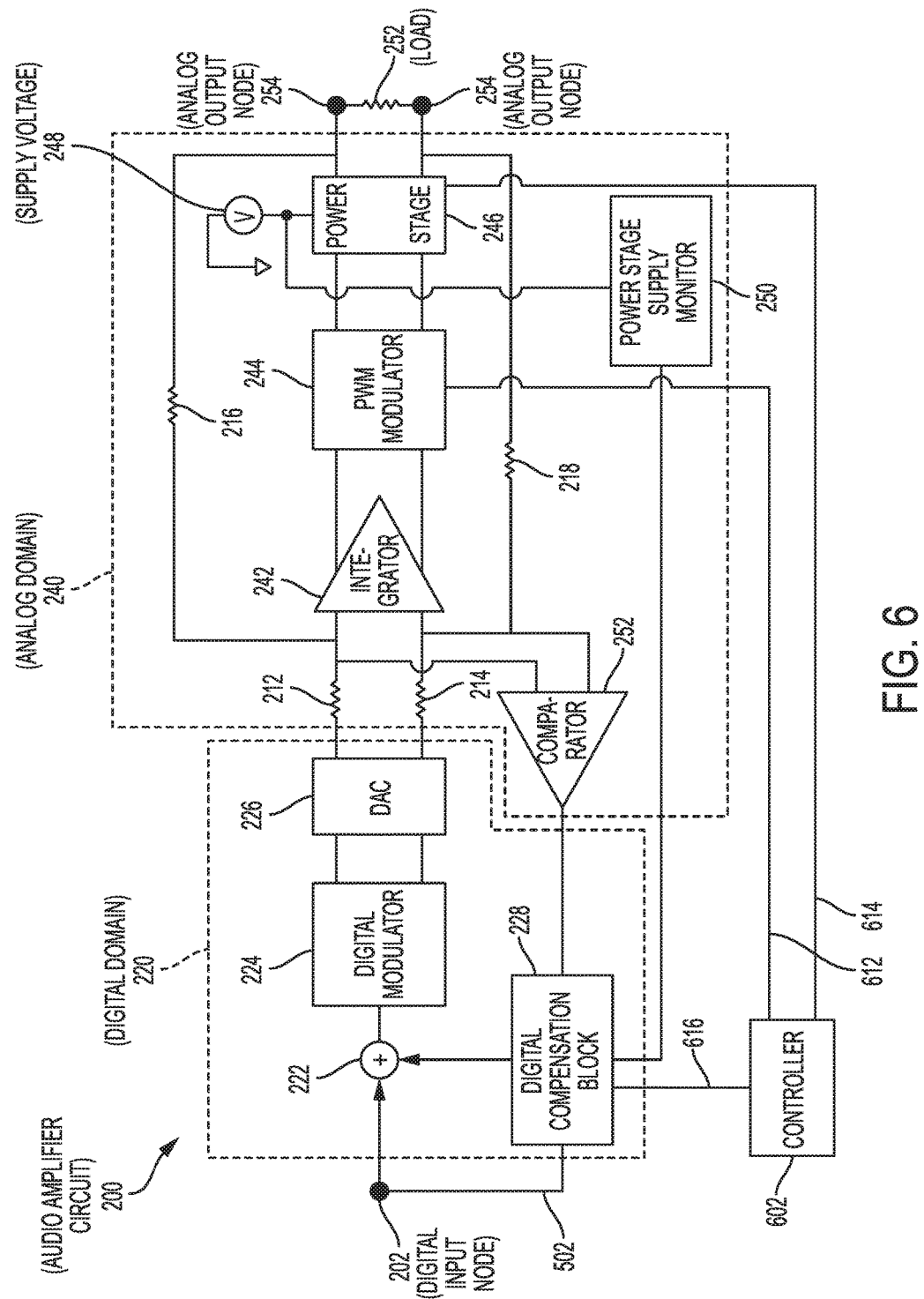
FIG. 6 is a block diagram illustrating an audio amplifier circuit with a controller for digital compensation for resistor mismatch according to some embodiments of the disclosure.

A controller may be used to coordinate operation of components of an audio amplifier circuit in performing the resistor mismatch measurement and digital compensation of the resistor mismatch. The controller may be, for example, part of an audio controller. In some embodiments, the controller and/or audio controller may be integrated with an amplifier, such as a class-D amplifier, as a single integrated circuit (IC) on a shared semiconductor die. One example circuit implementing a controller is shown in FIG. 6. FIG. 6 is a block diagram illustrating an audio amplifier circuit with a controller for digital compensation for resistor mismatch according to some embodiments of the disclosure. A controller 602 may be coupled through line 616 to the digital compensation block 228, coupled through line 612 to the PWM modulator 244, and/or coupled through line 614 to the power stage 246. During resistor mismatch measurement, such as block 102 of FIG. 1, the controller 602 may power down the power stage 246 and direct the digital compensation block 228 to execute a search algorithm to identify a digital code for compensating the resistor mismatch. The controller 602 may also read out and/or control a gain setting of the amplifier circuit 200 and/or a ramp amplitude of the PWM modulator 244. The information and/or control over these components may be used to build a look-up table or algorithm for applying digital compensation at different configurations of the amplifier circuit 200. The controller 602 may include a non-volatile memory for storing the identified digital codes and/or other information regarding the resistor mismatch, such that the resistor mismatch does not need to be measured at every start-up of the amplifier circuit 200. Thus, for example, the mismatch may be measured during production-test (PTE).

Figure 7:
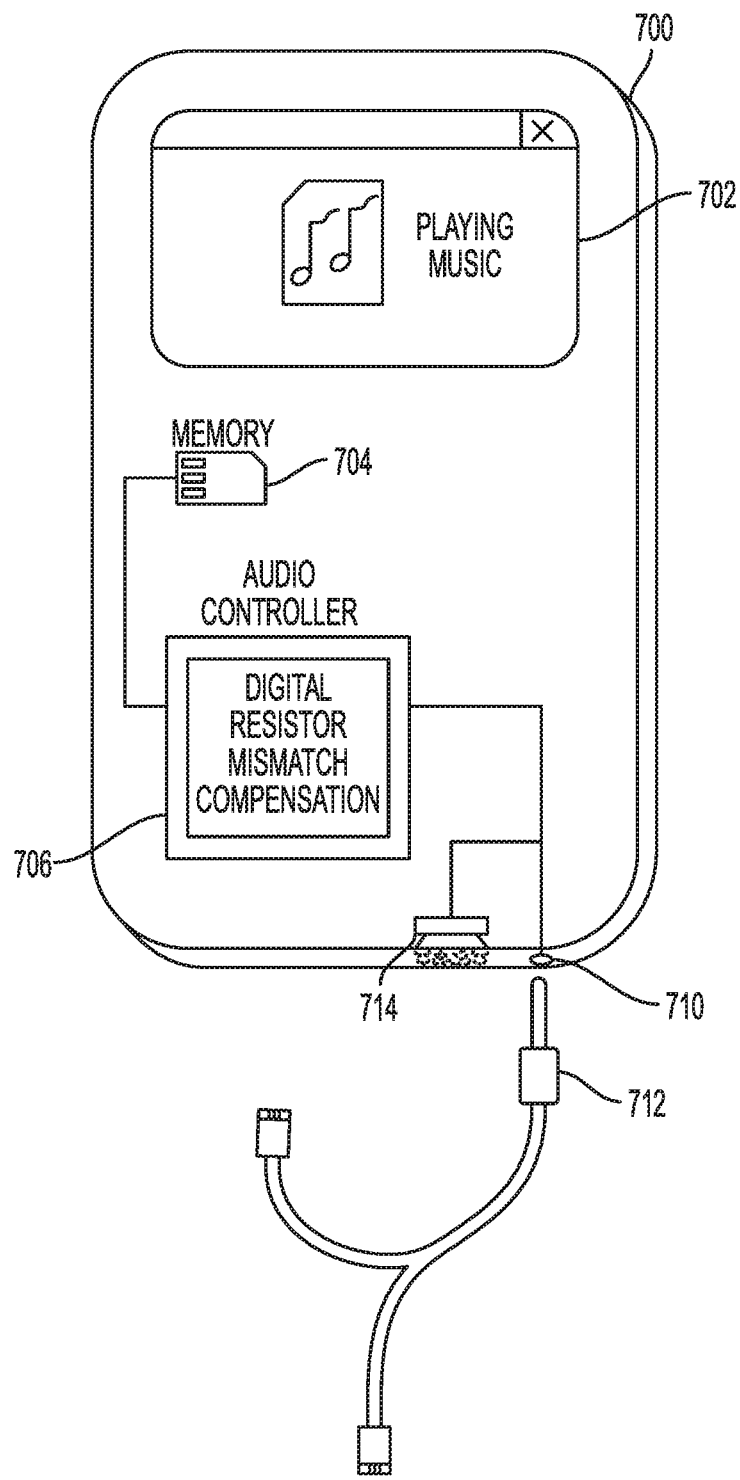
FIG. 7 is an illustration of a mobile device performing digital compensation for resistor mismatch during playback according to some embodiments of the disclosure.

One example of an electronic device incorporating the resistor mismatch techniques and systems described herein is shown in FIG. 7. FIG. 7 is an illustration of a mobile device performing digital compensation for resistor mismatch during playback according to some embodiments of the disclosure. A personal media device 700 may include a display 702 for allowing a user to select from music files for playback. When music files are selected by a user, audio files may be retrieved from memory 704 by an application processor (not shown) and provided to an audio controller 706. The audio data stream may be provided to the audio controller 706 as, for example, an MP3-encoded audio. The audio controller 706 may include resistor mismatch compensation described herein and/or resistor mismatch measurement described herein. The digital data retrieved from memory 704 may be converted to an analog signal by the audio controller 706, and the analog signal amplified by an amplifier integrated with or external to the audio controller to generate an analog output signal. The analog output signal may be provided to a microspeaker 714 integrated with the personal media device 700, and/or to headphones 712 coupled through an audio connector 710 such as a 2.5 mm, 3.5 mm, or USB-C connector. Although the data received at the audio controller 706 is described as being received from memory 704, the audio data may also be received from other sources, such as a USB connection, a device connected through Wi-Fi to the personal media device 700, a cellular radio, an Internet-based server, another wireless radio, and/or another wired connection. Moreover, the audio data may be different audio data than a music file. For example, the audio data may be a ringtone, a voice recording, a telephone call, a movie track, or a sound effect.

The schematic flow chart diagrams of FIG. 1, FIG. 3, and FIG. 4 are generally set forth as a logical flow chart diagram. Likewise, other operations for the circuitry are described without flow charts herein as sequences of ordered steps. The depicted order, labeled steps, and described operations are indicative of aspects of methods of the invention. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general purpose processor, such as a digital signal processor (DSP) capable of executing instructions contained in software. The firmware and/or software may include instructions that cause the processing of signals described herein to be performed. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although digital signal processors (DSPs) are described as one implementation of certain blocks or circuitry in the detailed description, aspects of the invention may be performed on other processors, such as graphics processing units (GPUs) and central processing units (CPUs). Further, although ones (1s) and zeros (0s) or highs and lows are given as example bit values throughout the description, the function of ones and zeros may be reversed without change in operation of the processor described in embodiments above. As another example, although processing of audio data is described, other data may be processed through the amplifier circuitry described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for amplifying an audio signal with audio amplifier circuitry, comprising:
   receiving a digital input signal;
   converting the digital input signal to an analog signal in a digital-to-analog converter (DAC);
   producing an output analog signal with an amplifier coupled to the digital-to-analog converter (DAC); and
   applying a digital compensation to the digital input signal to compensate for resistor mismatch in resistors of the audio amplifier circuitry, wherein the digital compensation is based, at least in part, on a resistor mismatch and a supply voltage.

2. The method of claim 1, further comprising monitoring a supply voltage of the amplifier to obtain the supply voltage.

3. The method of claim 1, further comprising predicting an output duty cycle of the amplifier based, at least in part, on the digital input signal.

4. The method of claim 3, wherein the step of predicting the output duty cycle is also based, at least in part, on a gain setting of the amplifier and a pulse-width modulation (PWM) modulator ramp amplitude.

5. The method of claim 4, wherein the step of applying digital compensation to the digital input signal is based, at least in part, on one or more digital output codes corresponding to a gain setting of the amplifier.

6. The method of claim 5, further comprising generating the one or more digital output codes by performing steps comprising:
   powering down a power stage of the amplifier, wherein the power stage is coupled to the analog output node;
   driving a load attached to the analog output node from a non-power stage component in an analog domain of the amplifier to a reference voltage different from a common mode voltage of the digital-to-analog converter (DAC), wherein the non-power stage component is coupled to the analog output node through the power stage;
   monitoring a differential input to the analog domain by comparing a first input of the differential input with a second input of the differential input;
   adjusting a digital compensation applied to the digital input node to identify a digital code that causes the first input to approximately equal the second input; and
   storing, in a memory, a digital code corresponding to the digital compensation that causes the first input to cross the second input.

7. The method of claim 6, wherein the step of adjusting the digital compensation to identify the digital code comprises adjusting the digital compensation until the digital code causes the first input to cross the second input.

8. The method of claim 6, wherein the step of applying the digital compensation comprises:
   retrieving the digital code;
   adjusting the digital code based on the supply voltage; and
   applying the adjusted digital code to the digital input signal to compensate for resistor mismatch.

9. An audio amplifier circuit, comprising:
   a digital-to-analog converter (DAC) coupled to a digital input node and configured to convert a digital input signal to an input analog signal;
   an amplifier comprising an analog input node and an analog output node, wherein the amplifier is configured to output to the analog output node an amplified version of the input analog signal received at the analog input node; and
   a digital compensation block coupled to the digital input node and configured to apply digital compensation to compensate for resistor mismatch to the digital input signal, wherein the digital compensation is based, at least in part, on a resistor mismatch and a supply voltage.

10. The apparatus of claim 9, further comprising a supply voltage monitor block configured to determine the supply voltage and coupled to the digital compensation block.

11. The apparatus of claim 9, wherein the digital compensation block is further configured to predict an output duty cycle at the analog output node, wherein the output duty cycle is based, at least in part, on the digital input signal.

12. The apparatus of claim 11, wherein the digital compensation block is configured to predict the output duty cycle based, at least in part, on a gain setting of the amplifier and a pulse-width modulation (PWM) modulator ramp amplitude of the amplifier.

13. The apparatus of claim 12, wherein the digital compensation block is configured to apply a digital code based, at least in part, on one or more digital compensation codes corresponding to the gain setting of the amplifier.

14. The apparatus of claim 13, wherein the digital compensation block is configured to generate the one or more digital compensation codes by performing steps comprising:
   monitoring a differential input to the amplifier by comparing a first input of the differential input with a second input of the differential input;
   adjusting the digital code applied to the digital input node to identify the digital code that causes the first input to approximately equal the second input; and
   storing, in a memory, the identified digital code corresponding to the digital compensation that causes the first input to cross the second input.

15. The apparatus of claim 13, wherein the digital compensation block is configured to apply digital compensation by performing steps comprising:
   retrieving a digital code for compensation;
   adjusting the digital code based on the supply voltage; and
   applying the adjusted digital code to the digital input signal to compensate for resistor mismatch before conversion of the digital input signal in the DAC.

16. A method for measuring resistor mismatch in an amplifier, the method comprising:
   powering down a power stage of the amplifier, wherein the power stage is coupled to an analog output node;
   driving a load attached to the analog output node from a non-power stage of the amplifier coupled to the analog output node through the power stage, wherein the load is driven to a voltage different from a common mode voltage of a digital-to-analog converter (DAC) of the amplifier;
   monitoring a differential input to the non-power stage; and
   adjusting a digital compensation applied to a digital input node based, at least in part, on the differential input.

17. The method of claim 16, wherein the step of monitoring the differential input comprises comparing a first input of the differential input with a second input of the differential input, and the step of adjusting the digital compensation comprises adjusting the digital compensation to cause the first input to approximately equal the second input.

18. The method of claim 17, wherein the step of adjusting the digital compensation comprises adjusting the digital compensation until the first input crosses the second input.

19. The method of claim 17, further comprising storing, in a memory, a digital code corresponding to the digital compensation that causes the first input to approximately equal the second input.

20. The method of claim 16, further comprising repeating the steps of monitoring the differential input and adjusting the digital compensation for a plurality of gain values for the amplifier.

21. An apparatus, comprising:
   a digital-to-analog converter (DAC) coupled to a digital input node and to an analog input node and configured to convert a digital input signal received at the digital input node to an input analog signal at the analog input node;

an amplifier comprising an analog output node, wherein the amplifier is configured to output to the analog output node an amplified version of an input analog signal received from the analog input node;

a digital compensation block coupled to the digital input node and configured to apply a code to compensate for resistor mismatch in resistors between the digital-to-analog converter (DAC) and the amplifier; and a controller coupled to the amplifier and to the digital compensation block, wherein the controller is configured to perform steps comprising:

powering down a power stage of the amplifier, wherein the power stage is coupled to the analog output node;

driving a load attached to the analog output node from a non-power stage component of the amplifier coupled to the analog output node through the power stage, wherein the load is driven to a reference voltage different from a common mode voltage of a digital-to-analog converter (DAC) coupled to the power stage of the amplifier;

monitoring a differential input to the non-power stage component; and adjusting a digital compensation applied to a digital input node using the digital compensation block, wherein the digital compensation is based, at least in part, on the differential input.

22. The apparatus of claim 21, wherein the controller is configured to monitor the differential input by comparing a first input of the differential input with a second input of the differential input.

23. The apparatus of claim 22, wherein the controller is configured to adjust by adjusting the digital compensation until the first input crosses the second input.

24. The apparatus of claim 23, wherein the controller is further configured to store, in a memory, a digital code corresponding to the digital compensation that causes the first input to cross the second input.

* * * * *